United States Patent [19]
Winter

[11] Patent Number: 5,170,417
[45] Date of Patent: Dec. 8, 1992

[54] PRESET NUMBER OF PULSES GENERATED WITHIN GIVEN TIME PERIOD EVEN WHEN TIME PERIOD CHANGES

[75] Inventor: Reinhold Winter, Wilnsdorf, Fed. Rep. of Germany

[73] Assignee: U.S. Philips Corp., New York, N.Y.

[21] Appl. No.: 667,685

[22] Filed: Mar. 8, 1991

[30] Foreign Application Priority Data

Mar. 8, 1990 [DE] Fed. Rep. of Germany ....... 4007293

[51] Int. Cl.$^5$ ..................... H03K 5/156; H03K 21/08
[52] U.S. Cl. ........................................ 377/44; 377/50; 377/56; 328/61; 328/129.1; 307/271
[58] Field of Search ....................... 377/44, 47, 28, 50; 328/61, 63, 129.1; 307/271

[56] References Cited

U.S. PATENT DOCUMENTS

| | | | |
|---|---|---|---|
| 3,725,795 | 4/1973 | Messenhimer | 307/360 |
| 3,935,538 | 1/1976 | Kizler et al. | 377/44 |
| 4,763,342 | 8/1988 | Ambrosio et al. | 377/44 |
| 4,809,221 | 2/1989 | Magliocco et al. | 377/44 |
| 4,912,734 | 3/1990 | Frauenglass | 377/44 |

FOREIGN PATENT DOCUMENTS

| | | |
|---|---|---|
| 2361271 | 6/1974 | Fed. Rep. of Germany . |
| 2334871 | 1/1975 | Fed. Rep. of Germany . |
| 2644868 | 4/1978 | Fed. Rep. of Germany . |
| 1545846 | 5/1979 | United Kingdom . |

Primary Examiner—John S. Heyman
Attorney, Agent, or Firm—Steven R. Biren

[57] ABSTRACT

A circuit arrangement generates a preset number of output pulses each time between two consecutive input pulses, the distance between the input pulses being subject to variation. The output pulses should be approximately evenly distributed, which even distribution, however, cannot be maintained when the cycle of the input pulses changes. To achieve first and foremost that the total number of output pulses is reached as quickly as possible in the case of a change in the input pulse cycle, the circuit includes a first counter device, which supplies a measure for the cycle duration of the input pulses in relation to a clock pulse, and this measure is used as a preset value for the next cycle for a further counter, which counts down the preset value in period with the clock pulses. The carry pulses of the further counter essentially indicate the output pulses, the number thereof is counted in each cycle by means of a third counter, which ends the further generation in the relevant cycle after the preset number has been reached, while in the case of a shortening of the input pulse cycle, any deficiency in the number of generated pulses is additionally inserted in the next cycle. As a result, the total number of the output pulses is made equal to the preset number in the shortest possible time, albeit to the detriment of an even distribution.

6 Claims, 4 Drawing Sheets

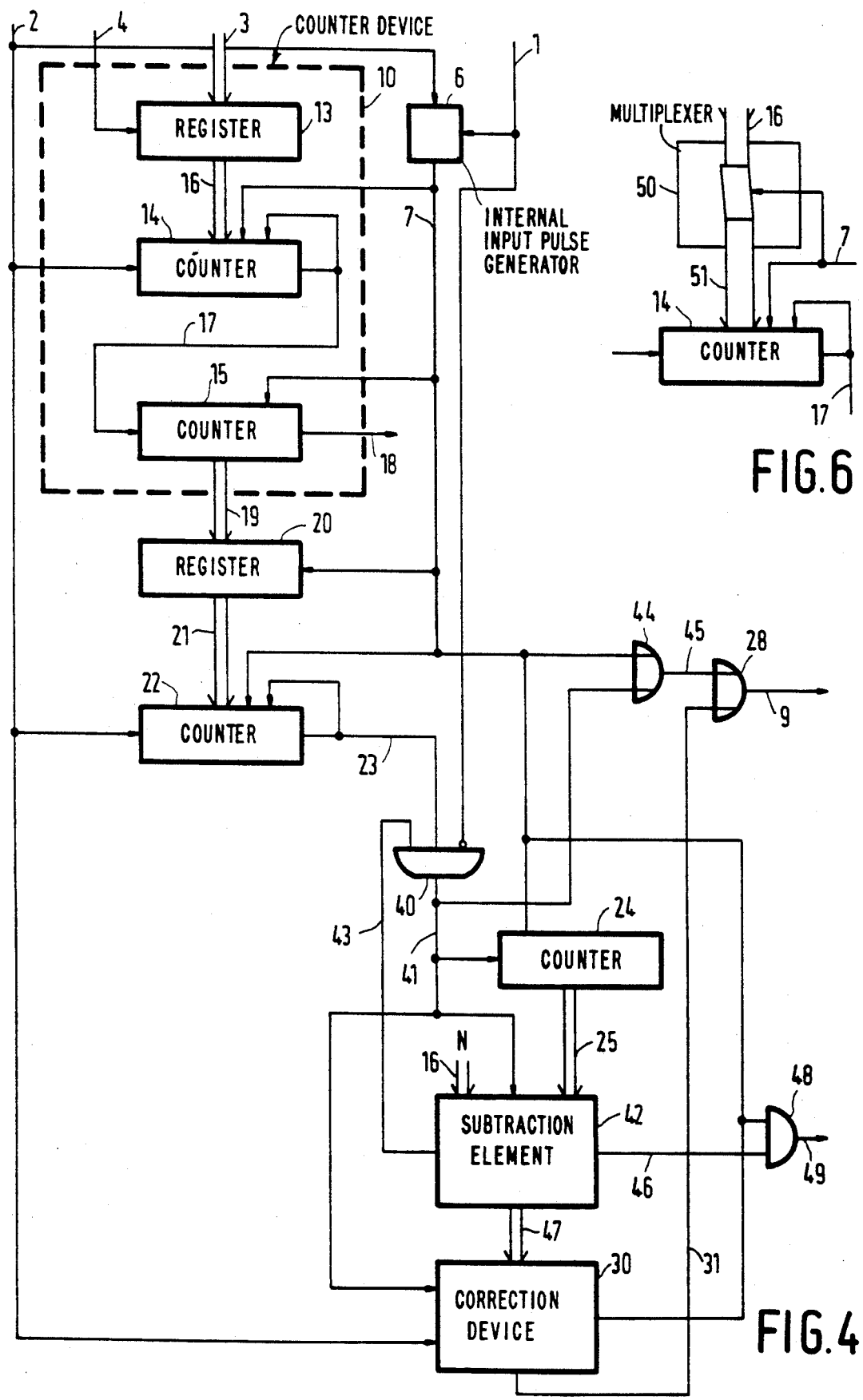

PRESET NUMBER OF PULSES GENERATED WITHIN GIVEN TIME PERIOD EVEN WHEN TIME PERIOD CHANGES

BACKGROUND OF THE INVENTION

The invention relates to a circuit arrangement for generating a preset first number of output pulses, having a substantially equal interspacing, between two input pulses having a variable interspacing, under the control of clock pulses which have a cycle duration which is constant at least in the short term, but considerably smaller than the interspacing of the output pulses.

Such a circuit arrangement essentially provides frequency multiplication and may be built up, for example, as a phase-coupled loop comprising a voltage-controllable oscillator whose output pulses are divided by the preset number by means of a counter and are compared in phase with the input pulses, the result of the comparison controlling the frequency of the oscillator via a low-pass filter. Such a phase-coupled loop may be of analog or digital design. If then the frequency of the input pulses, i.e. the distance between two consecutive input pulses, is changed, the frequency of the oscillator is so corrected that the number of output pulses between two consecutive input pulses again corresponds to the preset number. This correction, however, takes place with a delay owing to the action of the low-pass filter, and the total number of generated output pulses between several consecutive input pulses may temporarily considerably deviate from the value corresponding to the preset first number, i.e. in dependence on the time characteristic of the change in the input frequency and the dimensioning of the low-pass filter. In many applications, however, it is necessary for the number of output pulses to correspond to the preset first number as quickly as possible. This problem arises, for example, in a matrix printer which is to print various printing rasters with a very high repetition accuracy also over the entire printing width. A common divider must then be present for all occurring printing rasters, i.e. a clock signal having a correspondingly high frequency whose single pulses are coupled to the position of the print head with the highest possible exactness. Scanning of the print head position immediately at the print head is necessary for a high positioning accuracy of the single print dots, since otherwise the natural dynamics of the print head drive directly and negatively influence the accuracy. The direct generation of a fine raster rhythm corresponding to the common divider by a scanner element, which is moved together with the print head over a ruler positioned along the horizontal print path, is technically difficult and very expensive. Scanning of the print head position is accordingly only practicable with a comparatively rough subdivision. The corresponding finely divided raster pulses must then be generated from these roughly divided raster pulses with the resolution required by the common divider. These fine raster pulses must have a high accuracy as to their position and especially as to their total number as well as a strict relation to the rough division, so that the locations where printing starts in the print positions correspond as exactly as possible in consecutive print lines.

SUMMARY OF THE INVENTION

The invention has for its object to provide a circuit arrangement of the kind described in the opening paragraph which adapts the total number of output pulses so as to correspond exactly to the preset first number as quickly as possible, i.e. if possible at the end of the input pulse cycle following the change, also in the case of comparatively large variations in the distances between the input pulses.

According to the invention, this object is achieved by a first counter device, which counts the clock pulses, is reset at each input pulse and provides a count value divided by the first number, a register which receives the divided count value and stores it at each input pulse before the first counter device is reset, a second counter device which counts the clock pulses and is set at a value corresponding to the contents of the register at each input pulse and at each carry signal upon reaching an end position, the output pulses being derived from the carry signals, a third counter device which counts the carry signals after each input pulse, compares them with the first number and blocks the derivation of further output pulses from the carry pulses in the case of equality, and a correction device which at each input pulse receives the difference between the number of output pulses counted since the preceding input pulse and derived from the carry signals and the first number, and inserts between the carry signals a number of pulses corresponding to the difference as additional output pulses.

In this way the output pulses are generated after each change in the cycle duration between two input pulses in the next cycle with an interspacing which immediately corresponds exactly to the preceding cycle of the input pulses. However, if a continuous shortening of consecutive input pulse cycles takes place, i.e. the interspacing of several consecutive input pulse pairs is shorter each time than the interspacing of the preceding input pulse pair, a carry-over will of necessity take place to the next input pulse cycle. In any case, the correction of the number of output pulses is achieved in the shortest possible time.

It is true that an uneven distribution of the output pulses takes place temporarily in this, but this is unavoidable because at the beginning of each cycle the interspacings of the output pulses depend on the preceding cycle, since the length of the cycle just started cannot yet be known. This is basically true also for a lengthening of the input pulse cycle, in which case a void is created in the output pulses at the end of the cycle. Especially in the case mentioned above of the generation of a fine raster for a printer, however, it is important first of all that the total number of fine raster pulses in relation to the print start for a given print head position should be exactly reproducible and that no accumulating errors are created, since short-term deviations in the even distribution of the fine raster pulses have no influence on the print picture, because the fine raster interspacing is in any case smaller than the dimension of the print dot.

To maintain a certain buffer for small or slow changes in the input pulse cycle and to avoid the necessity of having to transfer output pulses frequently to the next cycle, it is effective if the second counter device counts one clock pulse fewer between the rest and the end position than corresponds to the contents of the register. It is true that a small void or unevenness in the output pulse distribution will occur at the end each time as a result in the normal situation, i.e. for a constant cycle duration of the input pulses, but this is not visible in the print picture in the described example of a fine raster for a printer and, indeed, also reproducible. A slight shortening of the cycle duration of the input pulses then leads merely to the substantial disappearance of this void, without output pulses having to be carried over to the next cycle.

The division of the count value of the first counter device may be carried out in various ways. A particularly favourable embodiment of the invention, in which the preset first number can also be very easily modified, is characterized in that the first counter device comprises a first counter, which counts the clock pulses and which is set for a position corresponding to the first number at each input pulse and at each carry signal upon reaching an end position, and a second counter which counts the carry signals of the first counter, the position of the second counter indicating the divided count value of the first counter device. This represents a certain subdivision of the counting levels required for counting the clock pulses, whereby the divided count value is created immediately without appreciable extra effort. Since the first number directly determines the position of the first counter, to which the latter is periodically set, this first number can also be easily modified.

If the cycle duration of the clock pulses is very much smaller than the cycle duration of the output pulses, the cycle of the latter is also set very accurately in relation to the relevant division of the input pulse cycle. If the ratio of this cycle, however, is not very great, it is favourable according to a further embodiment of the invention that the first counter is set for a position corresponding to half the first number at every input pulse and to a position corresponding to the whole first number at every carry signal of this counter. This results in an automatic rounding-up of the value stored in the register.

To keep the raster of the generated output pulses as constant as possible in relation to the input pulses, it is favourable according to a further embodiment that the second counter is reset to an initial position at every input pulse.

In order to generate the additional output pulses, the correction device according to a further embodiment of the invention is characterized in that the correction device receives the carry signals of the second counter device and supplies a trigger signal to a time function element incorporated in the correction device each time after a given second number of carry signals, while the time function element generates an additional output pulse after a given time interval, and in that a third counter counts the number of additional output pulses, compares them with the difference, and blocks the further generation of additional output pulses in the case of equality. The time function element may effectively be constructed as a further counter which is reset by the trigger signal to an initial value and which is counted up to a final position by the clock pulses, at which final position the additional output pulse is generated. The given second number may in fact also be 1, so that the additional output pulses are generated in the next cycle at every output pulse derived from a carry signal. The result of this is that the correction is carried out as quickly as possible in the case of a considerable shortening of the input pulse cycle, albeit to the detriment of an even distribution.

BRIEF DESCRIPTION OF THE DRAWING

Embodiments of the invention are explained in more detail below with reference to the drawing, in which:

FIG. 4 shows another embodiment of a device according to the invention, FIG. 6 shows in more detail the construction of the first counter therein.

DESCRIPTION OF THE PREFERRED EMBODIMENTS

Figure 1:
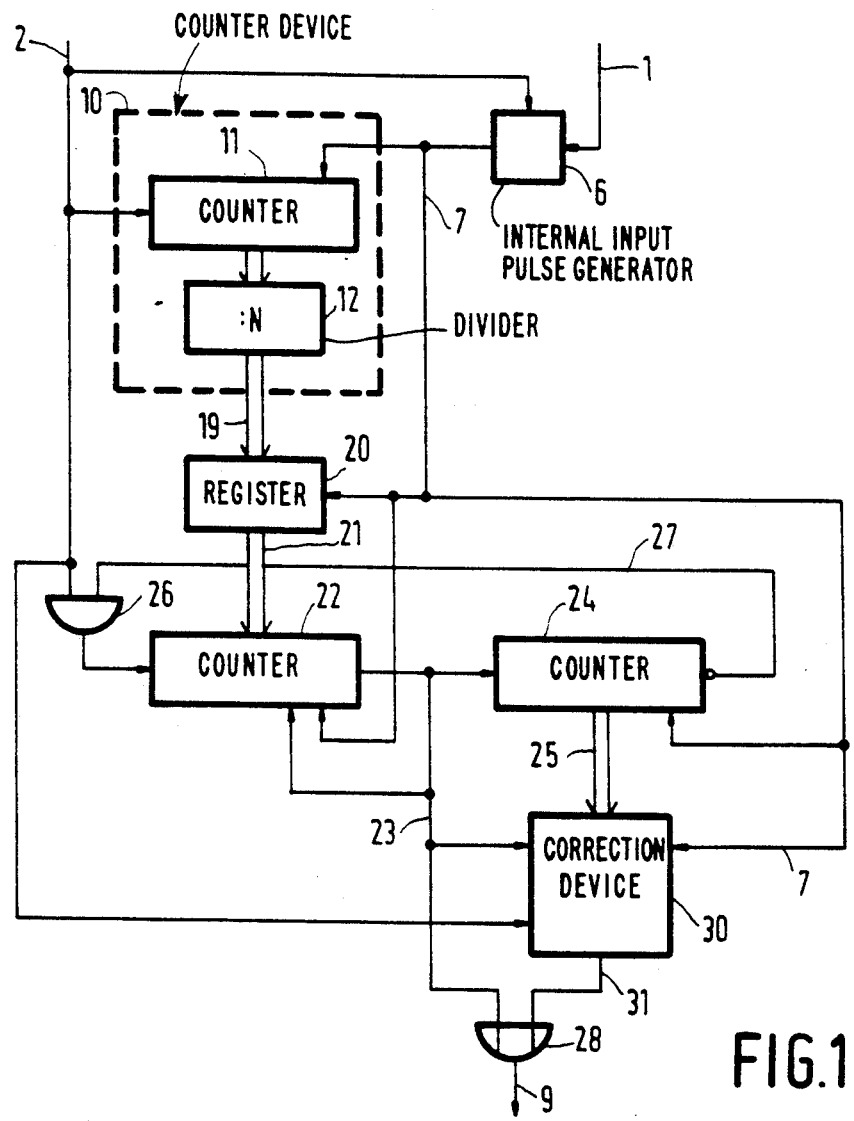
FIG. 1 shows a block diagram of a device according to the invention.

In the device represented in FIG. 1 as a block diagram, input pulses are supplied to an input 1, a given number N of output pulses having to be generated at output 9 in time between these input pulses. The control of the individual elements of the device takes place by means of clock pulses which are supplied from a clock pulse generator (not shown) via a line 2. Since the input pulses supplied to the input 1 cannot have an unequivocal phase relation to the clock pulses, and are also longer than one clock pulse, the input pulses are conducted to a device 6 in which an internal input pulse, which is only one clock pulse cycle long, is generated on line 7 from every input pulse by means of the clock pulses on the line 2. For the consecutive control of different elements at every input pulse it may also be favourable to derive two or more internal input pulses, which, however, is not essential to the principle of the invention.

The device of FIG. 1 comprises a counter device 10 with a counter 11 which continuously receives the clock pulses on the line 2 at the counting input. The counter 11 is reset to zero at every internal input pulse on line 7, so that the counter position always represents the number of clock pulses since the last internal input pulse. The counter position is divided by the given number N of output pulses generated between two input pulses in a device 12, and the divided value is supplied over parallel connection 19.

This divided counter value is written into a register 20 at the next internal input pulse on line 7 and supplied to the parallel input of a further counter 22 via connection 21, being equal to the number of clock pulses between the last two input pulses divided by the given first number N.

The counter 22 receives the clock pulses on the line 2 at the counting input via and AND gate 26, which is first opened via the line 27, and in addition the counter 22 is set at every internal input pulse on the line 7 as well as at every carry signal generated by itself on the line 23 to a position which corresponds to the value on the connection 21. This counter position may be the value on the connection 21 directly, if the counter 22 counts back, in which case the carry pulse is generated in the zero position, or the counter 22 is set for the complement of the value on the connection 21 and counts upwards until it reaches the maximum value, upon which the carry signal is generated.

When the cycle of the input pulses has been constant for at least two cycles, the desired output pulses are created on the line 23, as will be explained below.

When $f_c$ is the clock pulse frequency on the line 2 and $f_e$ the frequency of the input pulses, the value W on the connections 21 can be written as $$W = \frac{f_c}{f_e} \cdot \frac{1}{N} \qquad (1)$$

Since the counter 22 is periodically set for the value W, the clock pulse frequency divided by the value W also appears on the line 23 as a carry signal, so that the expression given above for W can be substituted $$\frac{f_c}{W} = f_c \frac{f_e \cdot N}{f_c} \qquad (2)$$

The result of this is that the frequency $f_a$ of the output pulses on the line 23 equals the input pulse frequency multiplied by the given first number N $$f_a = f_e \cdot N \qquad (3)$$

This will be explained in more detail below with reference to FIG. 2, which shows a time diagram of a few signals of the circuit according to FIG. 1. The numbers of the individual lines therein correspond to the lines or elements having the same reference numerals.

Figure 2:
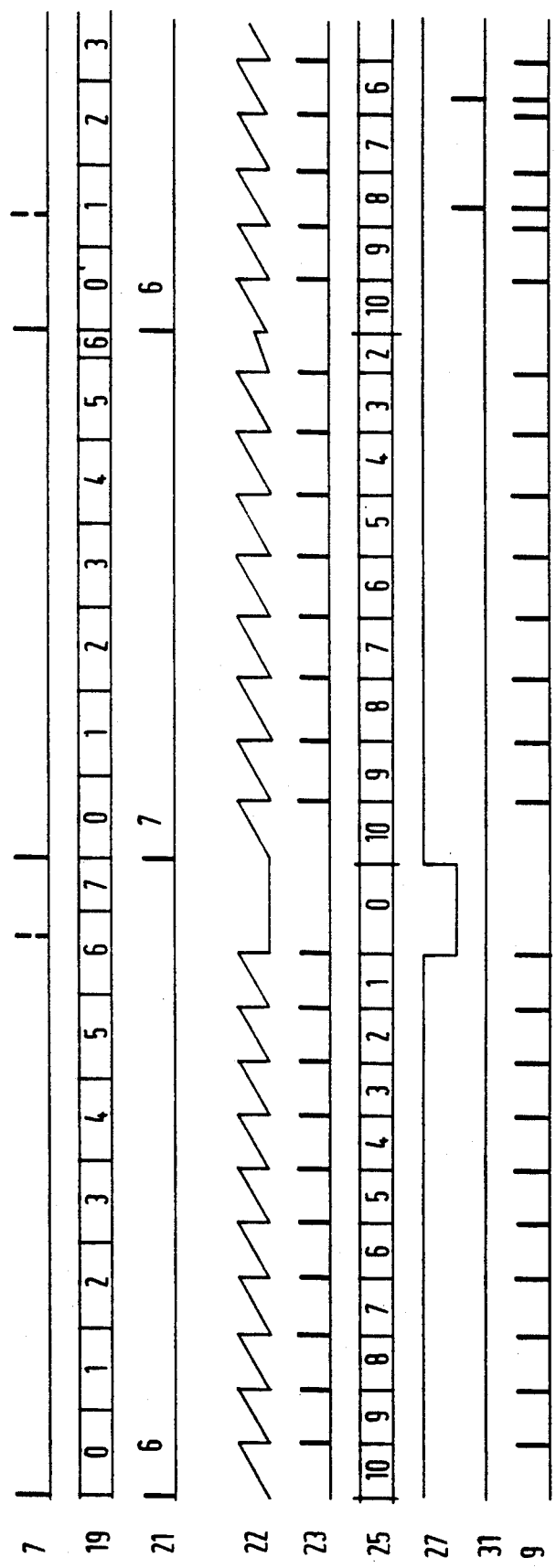
FIG. 2 shows a time diagram of the signals at various points in the block diagram of FIG. 1.

The time diagram comprises three consecutive internal input pulses with different interspacings, represented in FIG. 2 as drawn lines in line 7, since the system is based on a clock pulse frequency whose individual pulses can no longer be resolved in a drawing, each pulse in line 7, as well as in the lines 21, 23, 31 and 9 having the duration of one clock pulse. Broken lines in line 7 also indicate the moments at which an internal input pulse would have taken place if the cycle had not been subject to a change compared with the previous input pulse cycle.

The counter 11 is reset to its initial position at every internal input pulse and starts counting the clock pulses on the line. The divided counter positions then appear at output 19 in binary code, but they are indicated decimally in FIG. 2 for greater clarity.

At every internal input pulse, the divided counter position present at that moment at output 19 is entered into register 20 and appears at output 21. As can be seen from the first broken-line pulse in line 7 in FIG. 2, this divided counter position at output 19 was 6 at the arrival of the first internal input pulse, on the extreme left, so that the value at output 21 of register 20 up to the next internal input pulse is 6, as is indicated in line 21.

The counter 22 now periodically counts up to 6 each time, upon which it is reset to the initial position, as is indicated in line 22. A carry pulse is generated at every reset, which is represented in line 23.

The counter 24 is set for the position corresponding to the given number N=10 at every internal input pulse, counting back one position at every carry signal in line 23 until the position zero has been reached. In this zero position, the signal generated by the counter 24 on line 27 becomes low and renders the AND gate 26 non-conducting, so that the counter 22 after resetting to the zero position at the last carry signal remains in the zero position.

The counter position 0 at output 25 of the counter 24 is transferred to the correction device 30 at the next input pulse, so that no additional output pulses are consecutively generated. Simultaneously, the output 25 of the counter 24 jumps to the position 10 again, upon which the signal on line 27 becomes high again, and the counter 22 can resume periodic counting.

The second internal input pulse shown in FIG. 2, however, has occurred later than would correspond to the preceding cycle of the input pulses, so that before the appearance of this delayed input pulse a certain gap is created in the carry signals of line 23 and thus also in the output pulses in line 9, which under these conditions are derived from the carry signals only. At the same time, the counter position at output 19 has reached the value 7, so that now for the next cycle the value 7 appears at output 21 and the counter only counts to 7 periodically each time. As a result, the carry signals in line 23 and thus also the output signals in line 9 have somewhat greater interspacings.

The next internal input pulse, i.e. the third pulse shown in FIG. 2, now occurs considerably earlier than would have corresponded to the preceding cycle, namely already after the eighth carry signal of line 23, at which the counter position of line 25 has only reached value 2. As a result, this counter position is transferred into the correction device 30, so that also two additional output pulses must be generated in the next cycle. These are shown in line 31, it being assumed that an additional output pulse is generated after every second carry signal. The pulses of line 9 are accordingly a composite of the pulses of lines 23 and 31, and it is evident that temporarily a strong unevenness in the pulse distribution occurs, but that the total number of output pulses after the second additional output pulse is already the same as it would have been in the case of input pulses having a constant cycle.

The third internal input pulse shown in FIG. 2 indeed occurs when the divided counter position at output 19 has reached the value 6, so that now again the value 6 is present at output 21 for the next cycle and the interspacings of the carry signals are smaller than in the preceding cycle, in fact, the same as in the first cycle shown.

Figure 3:
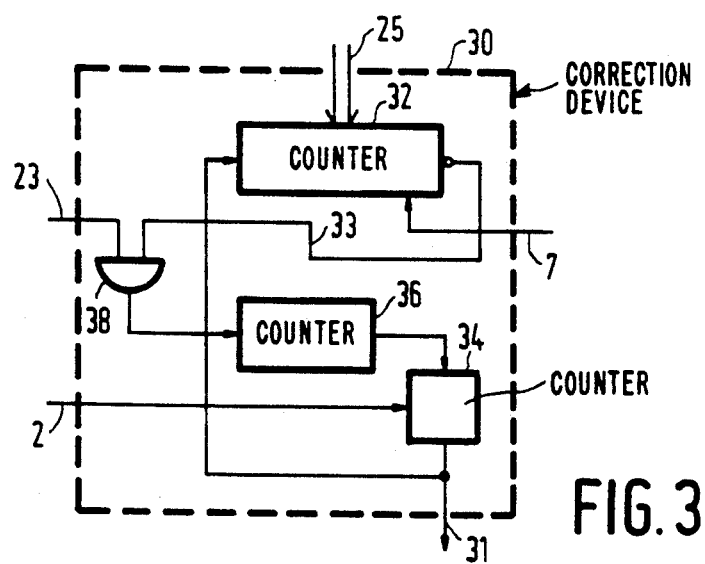
FIG. 3 shows a block diagram of an embodiment of a correction device.

A possible construction of the correction device 30 of FIG. 1 is shown in in FIG. 3. The counter position 25 at the output of counter 24, which indicates the output pulses yet to be additionally supplied, if any, is taken over into a counter 32 at every internal input pulse on line 7, which counter 32 as a result opens an AND gate 38 via line 33, so that the carry signals of line 23 can reach a cyclically counting counter 36. After a number of carry signals on line 23 corresponding to the cycle time of the counter 36, the latter supplies a trigger signal to a time function element 34 which supplies an additional output pulse on line 31, which simultaneously counts back the counter 32 by one position, after a time interval which is smaller than the shortest occurring cycle of the carry signals on line 23, but longer than a clock pulse cycle. The moment the counter 32 has reached its zero position, the AND gate 38 is blocked via line 33 so that no further additional output pulses can be generated.

The time function element 34 may advantageously be constructed as a counter which is set to an initial position by every trigger signal from counter 36 and then counts the clock pulses on line 2 up to a given final position at which the additional output pulse is supplied and at which it remains until it is reset again by a trigger signal.

The counter 36 may also be omitted, so that an additional output pulse is generated after every carry signal on line 23.

FIG. 4 shows a modification of the drawing shown in FIG. 1, in which corresponding circuit components are indicated with the same reference numerals. The first counter device 10 here comprises a register 13 into which a value supplied through an input 3 and indicating the number N of output pulses to be generated each time between two input pulses is written by means of a write pulse through an input 4. The value N at output 16 is supplied to a counter 14 which counts the clock pulses on line 2. With every internal input pulse on line 7, which pulse is again generated in device 6 from the external input pulse on line 1 by means of the clock pulse on line 2, the counter 14 is set for a position which corresponds to half the value N at output 16. This may be realised, for example, in the manner shown in FIG. 6, i.e. a multiplexer 50 is connected in front of the parallel reset inputs 51 of counter 14, connecting the parallel lines of the output 16 to the inputs for the least significant bits of the counter 14 and writing the complement of the value present at output 16 into this counter, which counter then counts up to the end position. At the end position, a signal is generated at the carry output 17 which again writes the value present at the reset input into the counter while, however, the multiplexer is now switched over, so that the parallel lines of output 16 are connected to the reset inputs shifted by one position, so that the counter now counts double the number of clock pulses each time until the end position is reached.

This is shown in the time diagram of FIG. 5, where again the individual lines are indicated with the numbers which are the same as the reference numerals of the lines or elements where the signals shown in the time diagram appear. The distance from the first internal input pulse on line 7 to the first carry signal on line 17 is only half as long as the distances between the subsequent carry signals.

The carry signals on line 17 are also supplied to a further counter 15 which is reset to the initial position with every internal input pulse on line 7. Counter positions now appear accordingly at output 19 of counter 15 and thus of the counter device 10, as is indicated in line 19 of FIG. 5. The shortened first counting cycle of counter 14 therefore results in a rounding-up of the counter position generated by counter 15 within one cycle between two input pulses.

This counter position at output 19 is again written into the register 20 with the next internal input pulse on line 7 and then appears at output 21. It is first assumed for the explanation of FIG. 5 that the value 7 was written into the register 20 in the preceding cycle.

It should be noted that in the present example the counter 15 counts half the frequency only after the first carry pulse as a result of the fact that the pulses on line 17 actually occur with half the frequency in counter 14 during the periodic new reset by the carry pulse to the position shifted by the multiplexer 50 as compared with non-shifted resetting, and the position at output 19 is actually only approximately half the value compared with non-shifted resetting of counter 14, however, this factor 2 can be corrected by a corresponding position shift somewhere, for example, also during writing into the register, if operation is not to take place first with the double frequency of the output pulses, which is then halved at a suitable location.

The counter 22 is now set for the position present at output 21 of the register by every internal input pulse on line 7 and by every carry pulse 23, but the carry pulse is supplied already one position before the end position. In this way each cycle of the counter 22 is made shorter compared with a nominal cycle, which results in a substantially equal distribution of the carry signals at a constant input pulse cycle, i.e. by one clock pulse duration, so that the output pulses are generated a little closer together than would be normal for the cycle and the last output pulse of each input pulse cycle is generated correspondingly earlier before this next input pulse is generated, so that an interval is created at the end each time, but the generation of additional output pulses is not immediately necessary then after a minor shortening of the input pulse cycle.

The output pulses on line 23 are now fed to the input of an AND gate 40 which receives a release signal via line 43, the generation of which will be described later, and which is rendered non-conducting via a further input for the duration of an external input pulse. The output line 41 of AND gate 40, in fact, is connected to one input of an OR gate 44 whose other input receives the internal input pulse, so that a pulse is generated at its output line 45 at each internal input pulse and subsequently at the ensuing carry signals on line 23 each time, as is shown in line 45 of FIG. 5. Blocking of the AND gate 40 by the external input pulse takes place to ensure synchronization.

Figure 5:
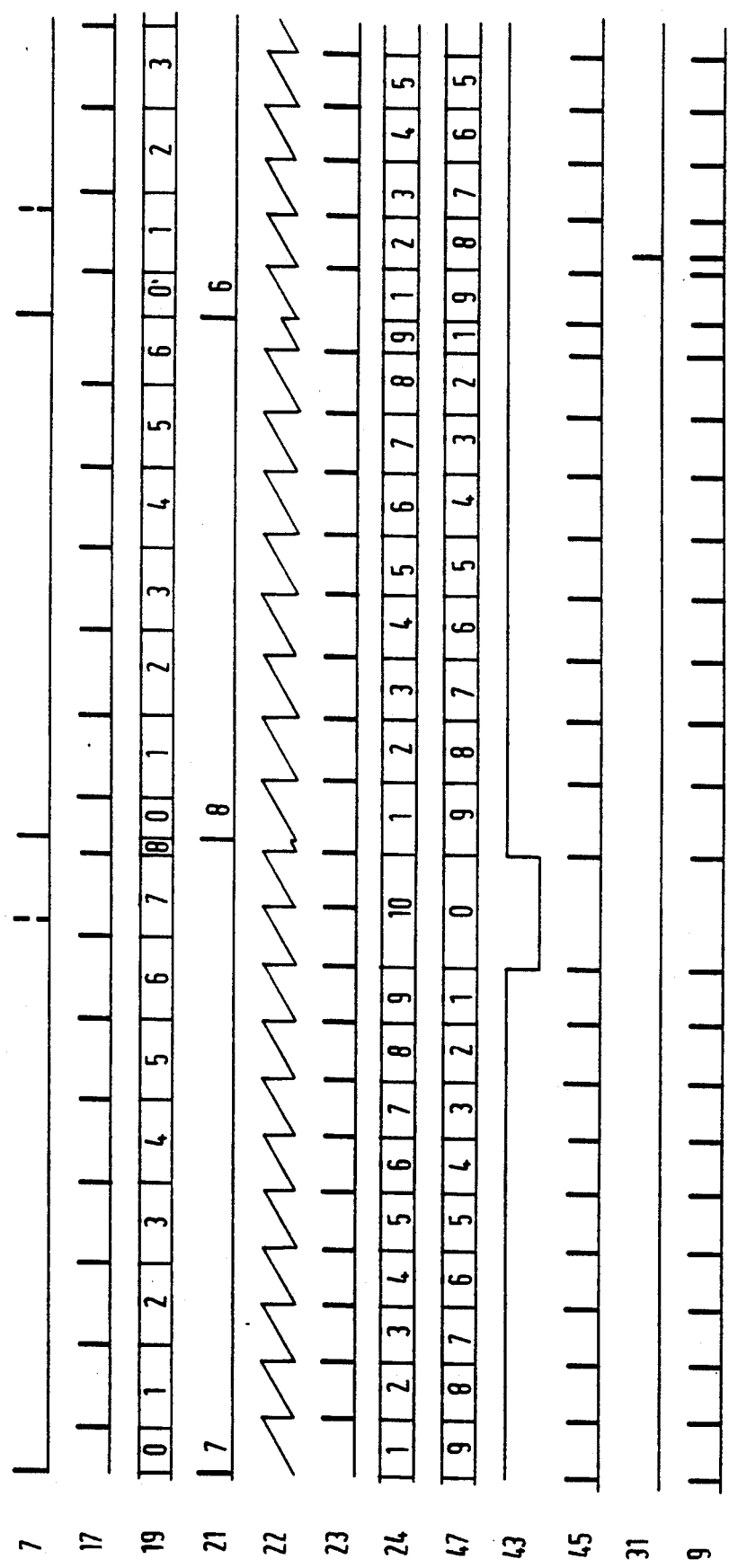
FIG. 5 shows a time diagram of the signals at various points in the block diagram of FIG. 4.

Line 41 is further connected to the count input of a counter 24 which is reset to position 1 at every internal input pulse, since the input pulse itself already represents the first output pulse, upon which each of the carry signals generated on line 23 is counted by counter 24, as is indicated in line 24 of FIG. 5. The counter position at output 25 of counter 24 is supplied to a subtraction element 42, which subtracts this value from the given number N supplied to the subtraction element 42 from output 16 of register 13. The difference between the two values appears at output 47 of subtraction element 42, so that as a result the values indicated in line 47 occur.

The moment the subtraction element 42 detects the difference 0, the AND gate 40 is blocked via line 43 and the subsequent carry signals on line 23 no longer appear on line 41 or 45, and the position 10 of counter 24 thus reached remains intact.

It can be seen in FIG. 5 that, if a new internal input pulse had occurred in accordance with the preceding cycle, as shown with a broken line in line 7 of FIG. 5, the next pulse on line 45 and thus the next output pulse at output 9 would have occurred at approximately the same distance as the preceding corresponding pulses, so that a substantially equal distribution results in the case of a constant input pulse cycle.

In fact, however, the next internal input pulse, i.e. the second pulse indicated in line 7, appears with a delay, in the same way as it has been shown in FIG. 2. The output 19 has just assumed the value 8 at this input pulse, so that this value is now written into register 20 and appears at output 21. Furthermore, the counter 22 is reset to zero again, the counter 24 is set to position 1, and the first of the output pulses for the next input pulse cycle appears again on line 45.

The next carry signals on line 23, and thus the output pulses on line 45 or output 9, now appear with somewhat enlarged interspacings in accordance with the prolonged preceding cycle which has resulted in the value 8 at output 21.

The third input pulse shown in FIG. 5 now occurs again, as in FIG. 2, after a shortened input pulse cycle before the counter 24 has reached position 10, and accordingly before the subtraction element 42 has reached the position 0 at output 47, the value 1 still being present here as a difference. This value is now taken over into the correction device 30 with this internal input pulse, while simultaneously the value 6, which is present at output 19 at this moment, is written into register 20, and furthermore the counter 22 is reset to 0 and the counter 24 to 1, and a pulse is again generated on line 45. The further procedure runs as in the preceding cycles, an additional output pulse being generated on line 31 by the correction device 30 after the first carry signal on line 23, which additional pulse then appears at output 9. The correction device 13 may be built up as explained with reference to FIG. 3.

A comparison of FIGS. 2 and 5 shows that the distribution of the output pulses at output 9 in FIG. 5 is somewhat more even, and only one additional output pulse is generated in spite of the considerable shortening of the input pulse cycle.

The block diagram of FIG. 4 shows two more outputs 18 and 49, where signals appear at certain error conditions. The output 18 is the carry output of counter 15, and a carry-over occurs there when the input pulse cycle is too long for a certain reset value, i.e. the maximum duration determined by the frequency of the clock pulses and the capacity of counter 15 is exceeded.

A signal appears at output 46 of subtraction element 42 as long as the difference between the number of output pulses generated during the relevant input signal cycle, which appears at output 25 of counter 24, and the given number N exceeds a given value. If this value is still exceeded while already the next internal input pulse appears at line 7, the AND gate 48 is opened and a signal appears at output 49. This signal indicates that the number of additional output pulses to be generated in the next cycle exceeds the preset value, i.e. the input pulse cycle has shortened itself too abruptly. A further error signal (not shown) may accordingly be generated if the input signal cycle prolongs itself too strongly in that the time interval after the appearance of the N-th output pulse and the next internal input pulse is monitored by means of the clock pulses.

I claim:

1. A circuit arrangement for generating a preset first number of output pulses, having a substantially equal interspacing, between two input pulses having a variable interspacing, under the control of clock pulses which have a cycle duration which is constant at least in the short term, but considerably smaller than the interspacing of the output pulses, characterized in that it comprises:
   a first counter device (10), which counts the clock pulses, is reset at each input pulse and provides a count value divided by the first number, a register (20) which receives the dividend count value and stores it at each input pulse before the first counter device (10) is reset;
   a second counter device (22) which counts the clock pulses, which is coupled to and receives an input from said register (20) and which is set at a value corresponding to the contents of the register (20) at each input pulse and at each carry signal upon reaching an end position, the output pulses being derived from the carry signals;
   a third counter device (24) which is coupled to and receives an input from said second counter device (22) and which counts the carry signals after each input pulse, said third counter device (24) comprising means for comparing said count with the first number and means for blocking the derivation of further output pulses from the carry pulses in the case of equality; and
   a correction device (30) which is coupled to and receives an input from said third counter device (24) and which at each input pulse receives the difference between the number of output pulses counted since the preceding input pulse and derived from the carry signals and the first number, and inserts between the carry signals a number of pulses corresponding to the difference as additional output pulses.

2. A circuit arrangement as claimed in claim 1, characterized in that the second counter device (22) counts one clock pulse fewer between the reset and the end position than the number of pulses which corresponds to the contents of the register (20).

3. A circuit arrangement as claimed in claim 1, characterized in that the first counter device (10) comprises a first counter (14), which counts the clock pulses and which is set for a position corresponding to the first number at each input pulse and at each carry signal upon reaching an end position, and a second counter (15) which counts the carry signals of the first counter (14), the position of the second counter (15) indicating the divided count value of the first counter device (10).

4. A circuit arrangement as claimed in claim 3, characterized in that the first counter (14) is set for a position corresponding to half the first number at every input pulse and to a position corresponding to the whole first number at every carry signal of this counter (14).

5. A circuit arrangement as claimed in claim 3, characterized in that the second counter (15) is reset to an initial position at every input pulse.

6. A circuit arrangement as claimed in claim 1, characterized in that the correction device (30) receives the carry signals of the second counter device (22) and supplies a trigger signal to a time function element (34) incorporated in the correction device (30) each time after a given second number of carry signals, while the time function element (34) generates an additional output pulse after a given time interval, and in that a third counter (32) counts the number of additional output pulses, compares them with the difference, and blocks the further generation of additional output pulses in the case of equality.

* * * * *